(12) United States Patent
Williams

(10) Patent No.: US 7,955,947 B2
(45) Date of Patent: Jun. 7, 2011

(54) METHOD OF FORMING ISOLATION STRUCTURE FOR SEMICONDUCTOR INTEGRATED CIRCUIT SUBSTRATE

(75) Inventor: Richard K. Williams, Cupertino, CA (US)

(73) Assignee: Advanced Analogic Technologies, Inc., Santa Clara, CA (US)

( * ) Notice: Subject to any disclaimer, the term of this patent is extended or adjusted under 35 U.S.C. 154(b) by 336 days.

(21) Appl. No.: 12/150,609

(22) Filed: Apr. 30, 2008

(65) Prior Publication Data

US 2008/0254592 A1      Oct. 16, 2008

Related U.S. Application Data

(62) Division of application No. 11/298,075, filed on Dec. 9, 2005.

(51) Int. Cl.
*H01L 21/76* (2006.01)
(52) U.S. Cl. .......................... 438/424; 257/329
(58) Field of Classification Search ............ 438/424
See application file for complete search history.

(56) References Cited

U.S. PATENT DOCUMENTS

| 5,472,904 | A | 12/1995 | Figura et al. | 438/426 |
| 5,915,191 | A | 6/1999 | Jun | 438/431 |
| 6,090,682 | A | 7/2000 | Lim | 438/407 |
| 6,737,330 | B2 | 5/2004 | Park | 438/396 |
| 7,354,812 | B2 | 4/2008 | Batra et al. | 438/196 |
| 2003/0013272 | A1 | 1/2003 | Hong et al. | 438/437 |
| 2004/0173844 | A1* | 9/2004 | Williams et al. | 257/329 |
| 2004/0183129 | A1 | 9/2004 | Williams et al. | 257/330 |
| 2005/0095872 | A1 | 5/2005 | Belyansky et al. | 438/778 |
| 2005/0167778 | A1 | 8/2005 | Kim et al. | 257/510 |
| 2006/0110892 | A1 | 5/2006 | Orlowski et al. | 438/435 |
| 2006/0166437 | A1* | 7/2006 | Korber | 438/257 |
| 2007/0132056 | A1 | 6/2007 | Williams | 438/424 |
| 2008/0203520 | A1 | 8/2008 | Williams | 257/506 |
| 2008/0203543 | A1 | 8/2008 | Williams | 257/499 |
| 2010/0055864 | A1 | 3/2010 | Williams | 438/424 |

FOREIGN PATENT DOCUMENTS

| JP | 02-238647 | 7/1990 |
| KR | 2002-4729 | 1/2002 |
| KR | 2004-59394 | 7/2004 |

OTHER PUBLICATIONS

Note: The References Numbered 7-9 Were Submitted With the IDS filed on May 29, 2007, in U.S. Appl. No. 11/298,075, Which is Relied on for an Earlier Effective filing date Pursuant to 35 U.S.C. 120. Accordingly, Pursuant to 37 CFR 1.98(d), Those References are not Enclosed Herewith.

* cited by examiner

*Primary Examiner* — Quoc D Hoang
*Assistant Examiner* — Tony Tran
(74) *Attorney, Agent, or Firm* — Patentability Associates

(57) ABSTRACT

Isolation regions for semiconductor substrates include dielectric-filled trenches and field oxide regions. Protective caps of dielectric materials dissimilar from the dielectric materials in the main portions of the trenches and field oxide regions may be used to protect the structures from erosion during later process steps. The top surfaces of the isolation structures are coplanar with the surface of the substrate. Field doping regions may be formed beneath the field oxide regions. To meet the demands of different devices, the isolation structures may have varying widths and depths.

6 Claims, 20 Drawing Sheets

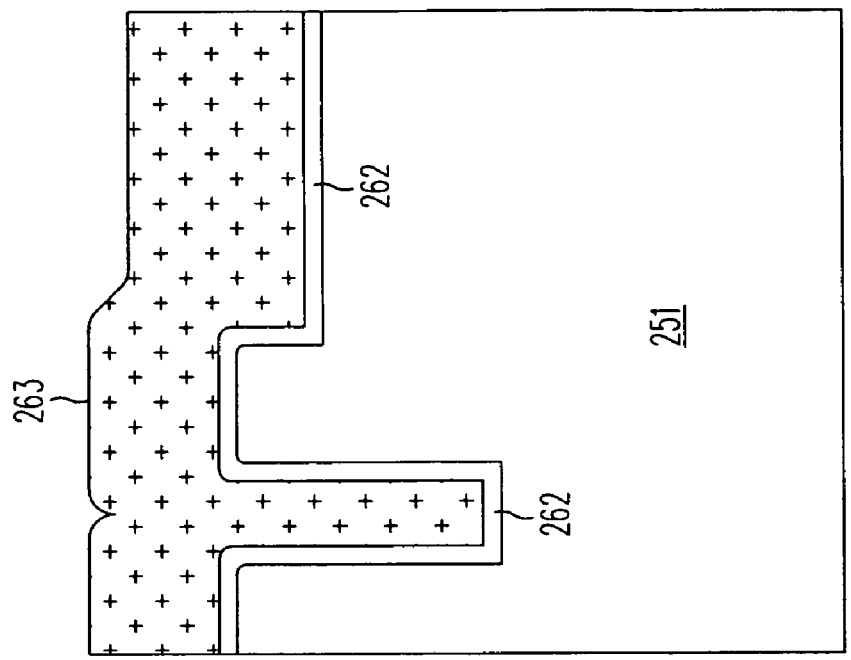
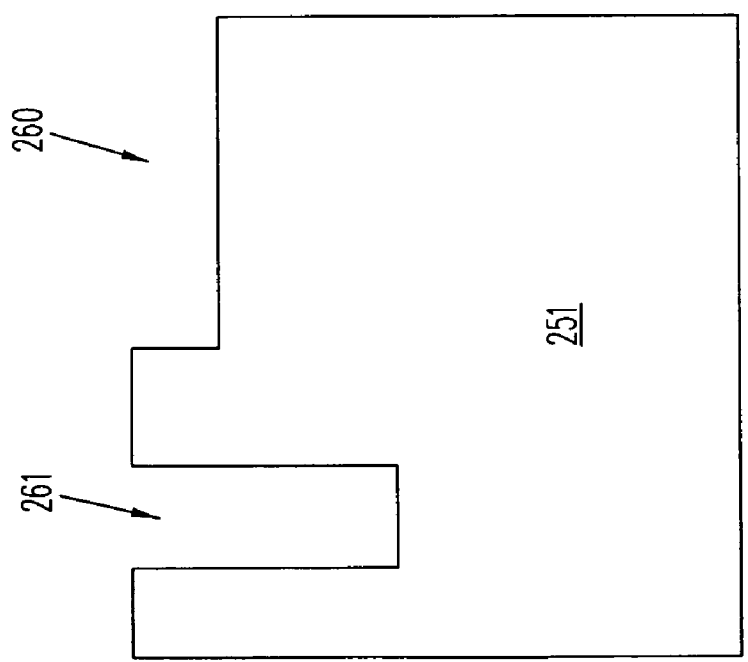

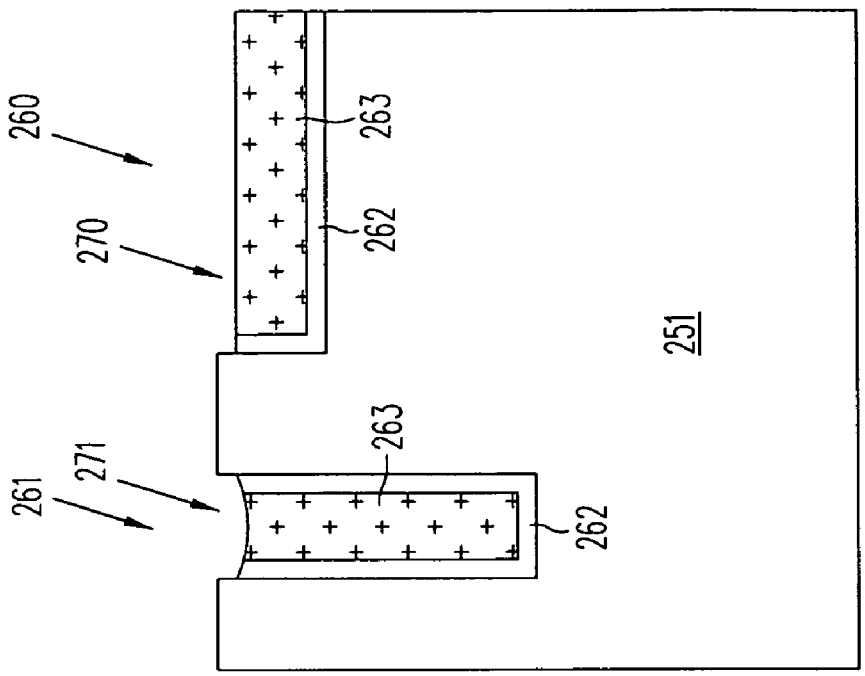
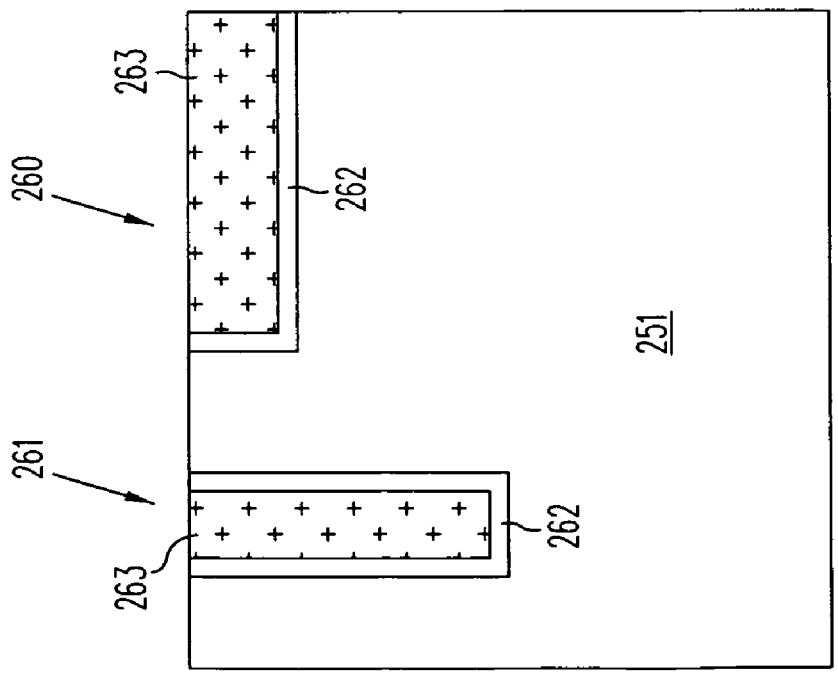
FIG. 7E
FIG. 7F

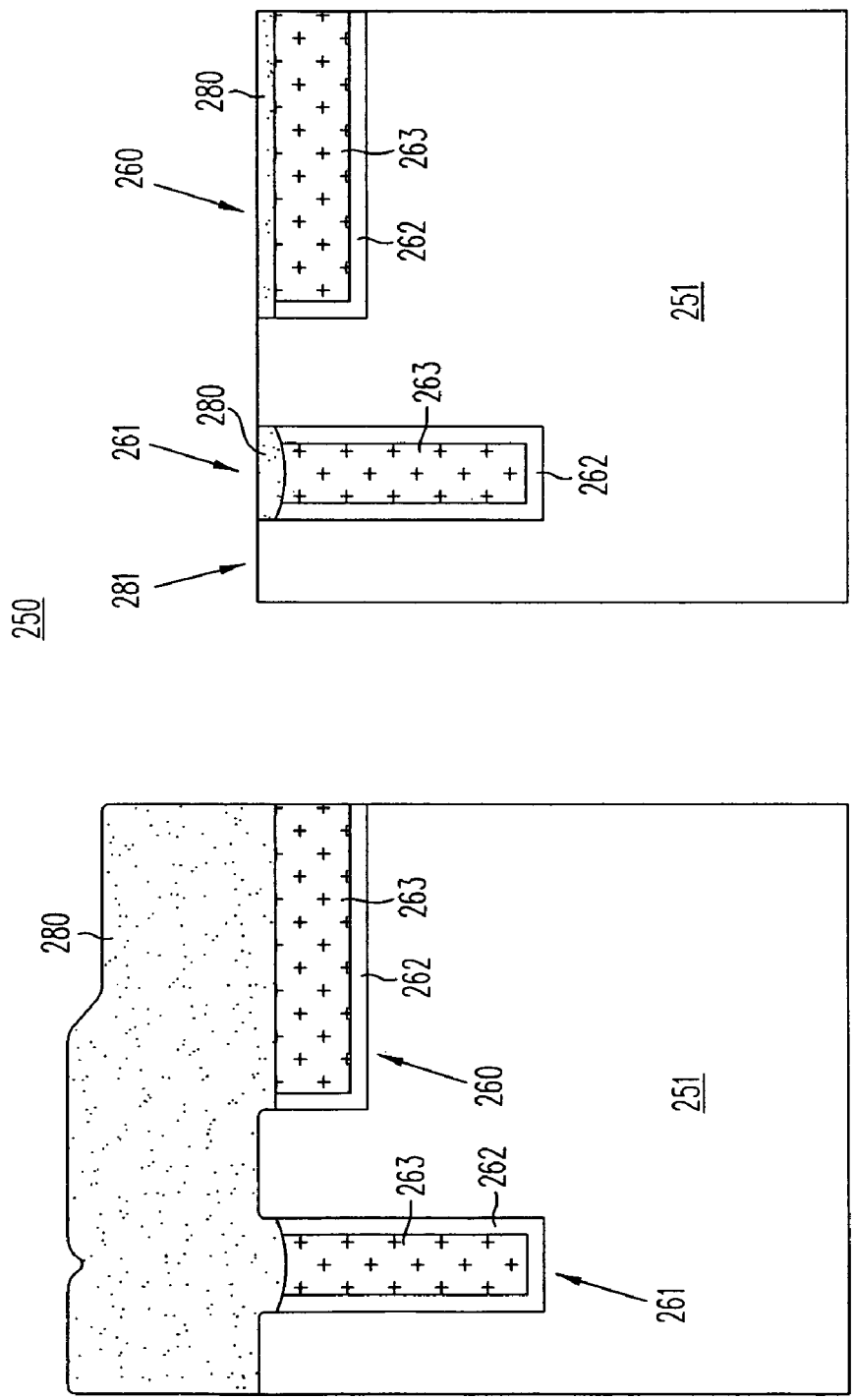

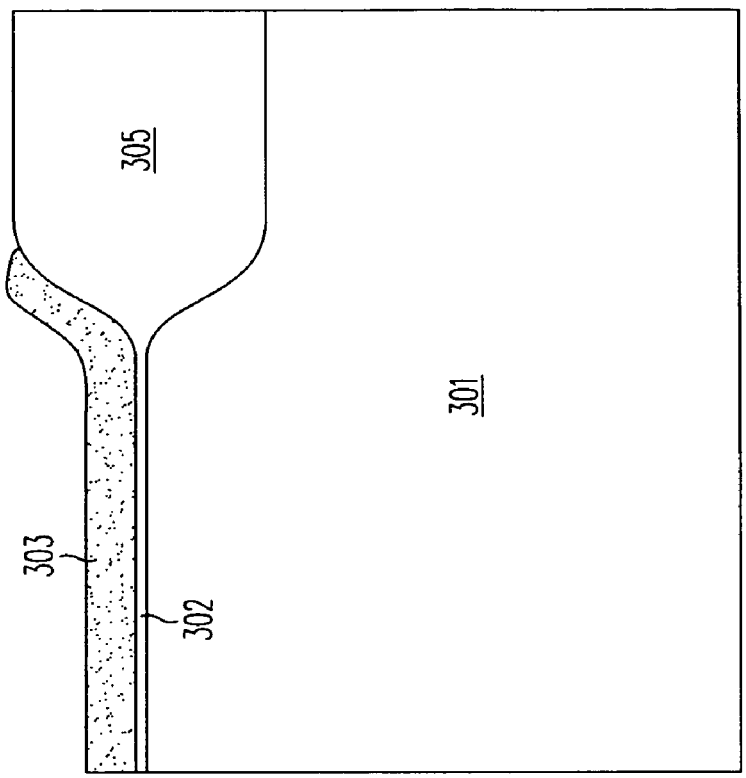
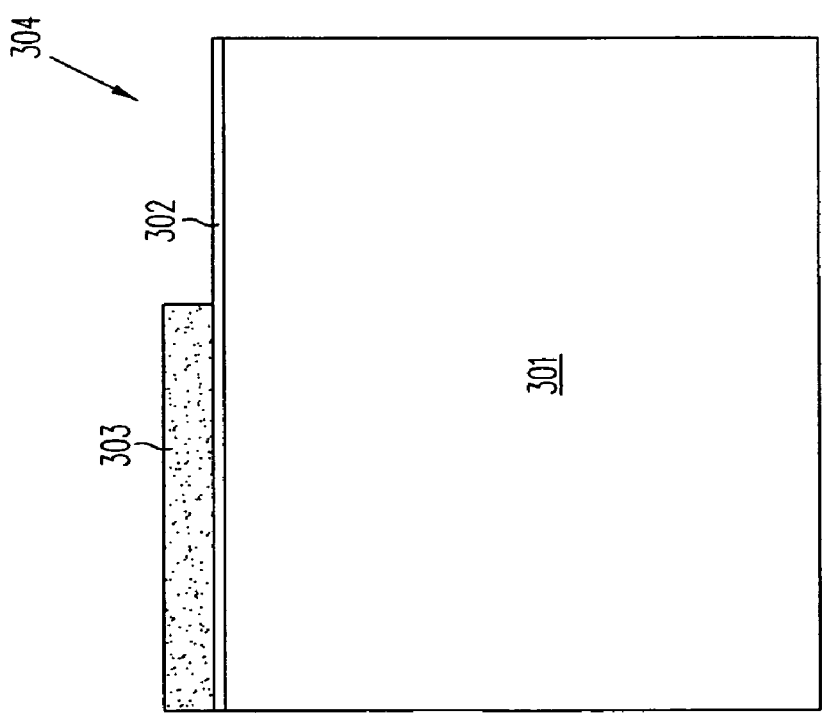
FIG. 8B
FIG. 8A

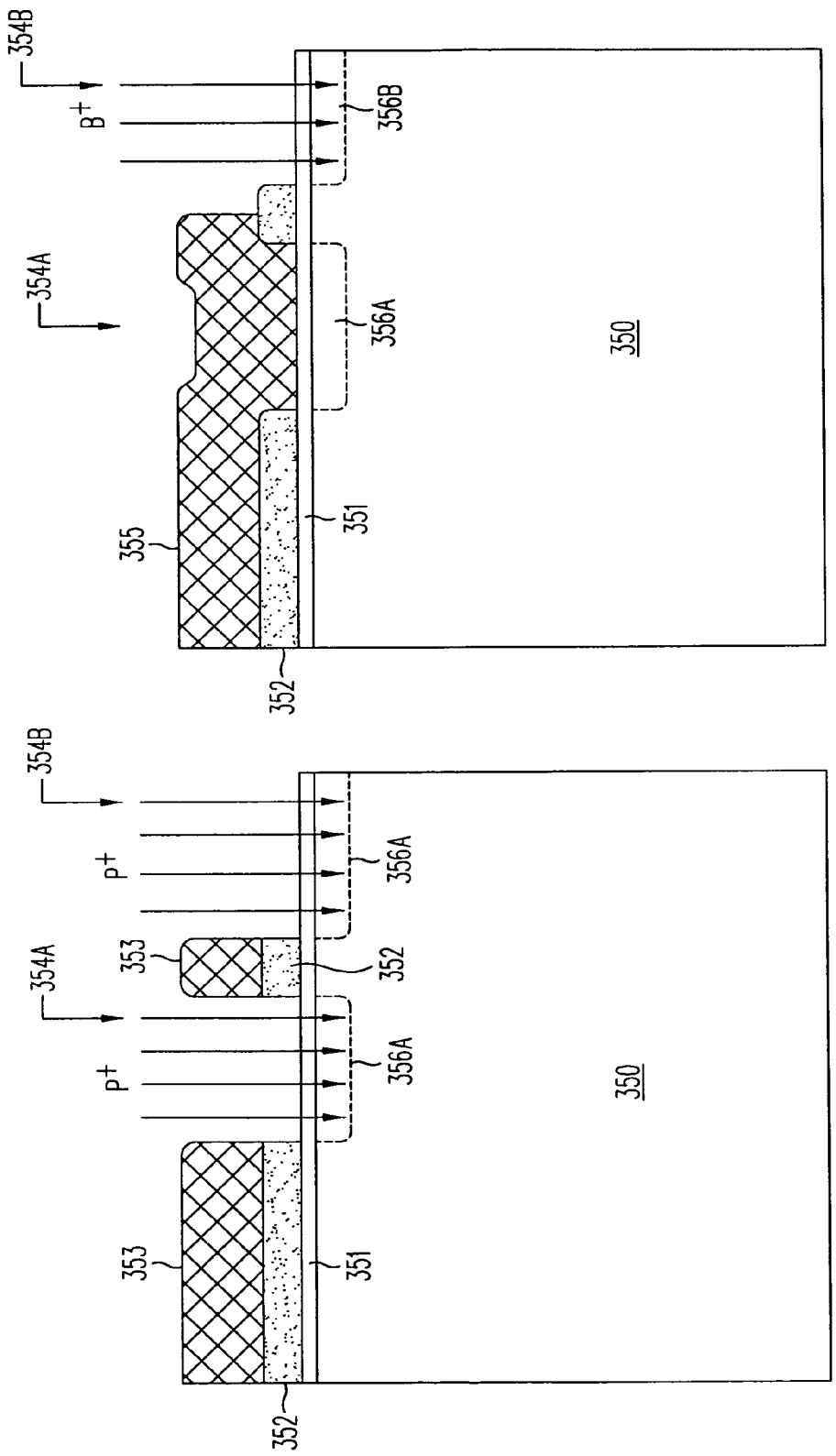

US 7,955,947 B2

METHOD OF FORMING ISOLATION STRUCTURE FOR SEMICONDUCTOR INTEGRATED CIRCUIT SUBSTRATE

CROSS-REFERENCE TO RELATED APPLICATION

This application is a divisional of application Ser. No. 11/298,075, filed Dec. 9, 2005, which is incorporated herein by reference in its entirety.

FIELD OF THE INVENTION

This invention relates to semiconductor chip fabrication and in particular to methods of fabricating structures to isolate electrically the active or passive devices formed on a semiconductor chip.

BACKGROUND OF THE INVENTION

In the fabrication of semiconductor integrated circuit (IC) chips, it is frequently necessary to electrically isolate devices that are formed on the surface of the chip. There are various ways of doing this. A way is by using the well-known LOCOS (Local Oxidation Of Silicon) process, wherein the surface of the chip is masked with a relatively hard material such as silicon nitride and a thick oxide layer is grown thermally in an opening in the mask. Another way is to etch a trench in the silicon and then fill the trench with a dielectric material such as silicon oxide.

It is desirable to form these isolation structures early in the process because they can also act as barriers or stops to the lateral diffusion of dopants, thereby allowing a more closely packed device population on the surface of the chip. In short, a dielectric-filled trench can function as a diffusion stop as well as an electrical isolation structure.

The problem with forming a dielectric-filled trench early in the process it that subsequent process steps, which frequently include etching and cleaning, can etch or erode the dielectric material in the trench. This can impair the value of the trench as an isolation structure and can create depressions in the top surface of the chip, rendering further processing more difficult.

This problem is illustrated in FIGS. 1A-1C. In FIG. 1A, a trench 101 has been etched in a semiconductor substrate 100. In FIG. 1B, trench 101 has been filled with a dielectric material 102 and the top surface has been planarized (e.g., by chemical-mechanical polishing) to form an isolation structure. FIG. 1C shows the isolation structure after further processing, with part of the dielectric material 102 removed or eroded so as to form a recess or gap 103 on the top surface of the structure. Dielectric materials that are resistant to etching in normal semiconductor processes (e.g., silicon nitride) tend to be hard, brittle, high-stress materials. When these materials are deposited in a trench they tend to crack.

A second problem stems from the fact that chips are generally divided into two general areas: broad or wide "field" areas and more densely-packed device areas, sometimes referred to as "active" areas. It is preferable to form relatively narrow, deep trenches in the active areas to maintain a tight packing density and to form relatively wide trenches in the field areas to space out the devices over larger distances. This creates a problem in filling the trenches. The narrow trenches may be filled while the wide trenches are difficult to fill. Alternatively, using numerous narrow trenches to cover large distances in the field areas can complicate the topography of the chip.

Accordingly, it would be desirable to develop a flexible, adaptable technique of forming dielectric-filled isolation structures that avoid the erosion of the dielectric fill material during subsequent processing. It would also be desirable to provide for the formation of relatively wide and narrow structures in the field and active regions, respectively, of the chip.

SUMMARY OF THE INVENTION

According to this invention, an isolation structure is formed by filling a trench in a semiconductor substrate with a "dielectric fill." The dielectric fill includes a first dielectric material and a second dielectric material. The first dielectric material is located in a lower portion of the trench; the second dielectric material is located in an upper portion of the trench, the lower portion typically being larger in the vertical dimension than the upper portion. The surface of the second dielectric material is substantially coplanar with a surface of the substrate. The first and second dielectric materials are dissimilar in the sense that the second dielectric material is not etched by a chemical which etches the first dielectric material. Thus in subsequent processing the second dielectric material forms a protective cap over the first dielectric material. Typically, the first dielectric material is a relatively soft, low-stress material and the second dielectric material is a relatively hard, etch-resistant material. Cracking problems can be avoided by limiting the thickness of the second dielectric layer to a value that provides protection during later etching processes but does not create stress problems.

Alternatively, instead of forming a discrete cap, the trench may be filled with a "graded" dielectric, wherein the proportion of the second dielectric material in the dielectric fill increases gradually as one moves upward towards the mouth of the trench.

The sidewalls of the trench may be lined with an oxide layer to prevent dopants from the dielectric fill from migrating into the semiconductor substrate.

In one group of embodiments the first dielectric material is a silicon oxide and silicate glass, either doped or undoped. The second dielectric can be silicon nitride, a polyimide or any dielectric material containing little or no silicon oxide.

The substrate may also include the lower portion of a field oxide region, typically formed by a local oxidation of silicon (LOCOS) process. The surface of the field oxide region is also substantially coplanar with the surface of the substrate. Alternatively, a protective cap may be formed over the field oxide.

In another group of embodiments, the substrate contains two isolation structures, the first formed in a relatively shallow, wide trench, the second formed in a relatively narrow, deep trench. Both trenches are filled with a dielectric fill and the surface of the dielectric fill is substantially coplanar with the surface of the substrate. Alternatively, a protective cap of the kind described above may be formed at the mouth of each trench.

In yet another set of embodiments, one or more field oxide regions are formed in the same substrate as one or more trench isolation structures. Field doping regions of predetermined conductivity type and doping concentration may be formed under the field oxide regions. Optionally, protective dielectric caps may be formed where the trenches and field oxide regions meet the plane of the surface of the substrate. The surface of the entire structure is substantially coplanar. The surface mab be planarized by using a chemical etchback, a plasma-enhanced or reactive ion etch (RIE), chemical-mechanical polishing (CMP) or some combination thereof.

The invention also includes methods of fabricating isolation structures. One such method includes forming a trench in the semiconductor substrate; depositing a first dielectric material in the trench; removing a portion of the first dielectric material such that a surface of the first dielectric material is located at a first level below a second level of a top surface of the substrate, thereby forming a recess; depositing a second dielectric material in the recess; and removing a portion of the second dielectric material such that a surface of the second dielectric material is substantially coplanar with the surface of the substrate, thereby forming a protective cap in the trench.

Another method includes thermally forming a field oxide region at a surface of the semiconductor substrate; forming a trench in the substrate; depositing a first dielectric material in the trench; removing a portion of the first dielectric material such that a surface of the first dielectric material is located at a first level below a second level of the surface of the substrate, thereby forming a recess; depositing a second dielectric material in the recess; and removing portions of the field oxide region and the second dielectric material such that a surface of the field oxide region and a surface of the second dielectric material are substantially coplanar with the surface of the substrate, thereby forming a protective cap in the trench.

The methods of this invention are highly flexible and can be used to form isolation regions necessary meet the varying demands of different regions and devices in a semiconductor substrate. The topography of the substrate is maintained extremely flat, or at least sufficiently flat as not to interfere with or complicate the formation of fine line widths and submicron features or the interconnection thereof during subsequent processing. Protective caps can be used to protect the dielectric materials from erosion during subsequent processing.

BRIEF DESCRIPTION OF THE DRAWINGS

FIGS. 7A-7H illustrate a processing for forming isolation structures which include a wide, shallow trench and a narrow, deep trench.

FIGS. 8A-8J illustrate another process for forming isolation structures that include a broad or wide field oxide region and a relatively narrow dielectric-filled trench, with a protective cap formed at the top of each structure.

FIGS. 9A-9E illustrate a process for forming isolation structures that include a pair of field oxide regions and a dielectric-filled trench, with field doping regions beneath the field oxide regions.

DESCRIPTION OF THE INVENTION

Figure 1C:
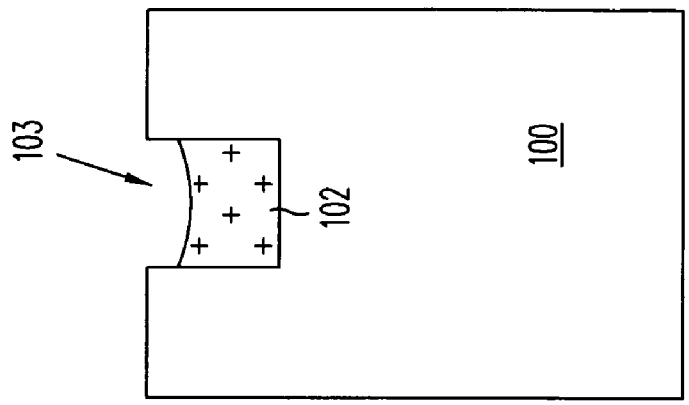
FIGS. 1A-1C illustrate the problem that occurs when the dielectric in a trench which serves as an isolation structure is eroded during later processing.
Figure 1B:
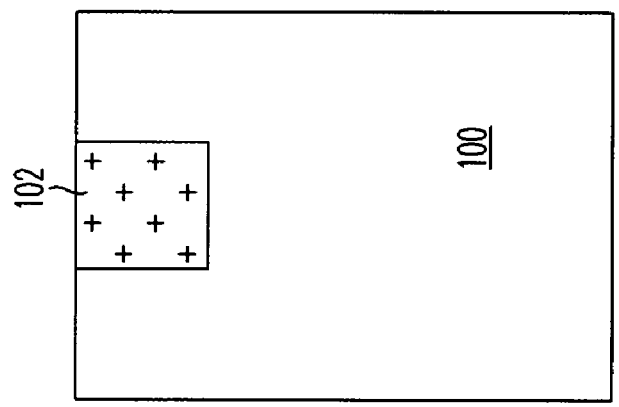
Figure 1A:
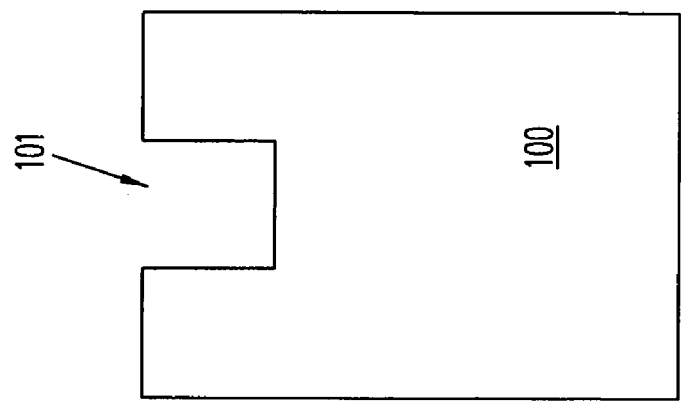
Figure 2C:
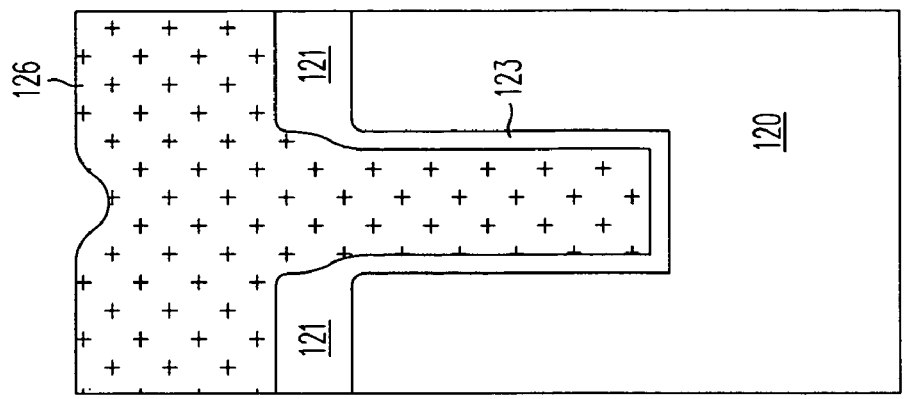
FIGS. 2A-2F illustrate a process for forming an isolation structure that includes a protective cap at the mouth of a dielectric-filled trench.
Figure 2B:
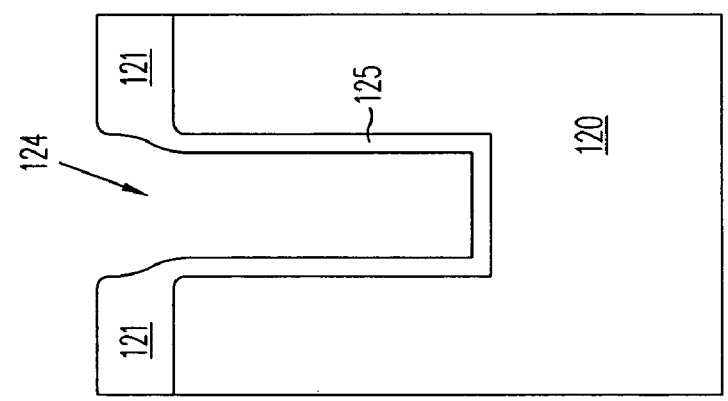
Figure 2A:
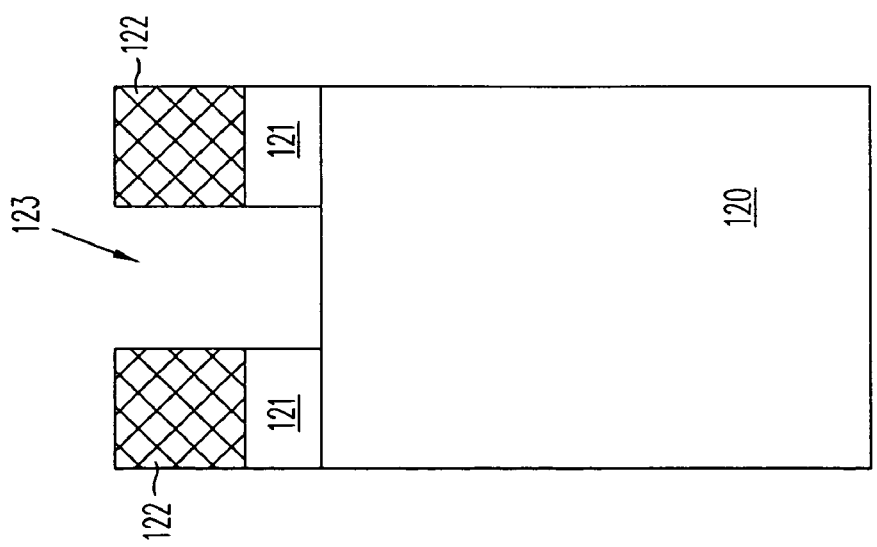

FIGS. 2A-2F illustrate a process for fabricating a trench isolation structure that avoids the formation of a gap or recess at the top of the trench, as shown in FIG. 1C. As shown in FIG. 2A, an oxide or "hard mask" layer 121 is formed on the top surface of a semiconductor substrate 120, and a photoresist layer 122 is deposited on top of hard mask layer 121. The term "hard mask" is used herein to refer to a thermally grown or deposited dielectric layer used as a mask during the etching of a trench in semiconductor substrate 120. The "hard mask" is distinguished from the organic photoresist layer 122, for example, which is mechanically softer and therefore subject to erosion during the trench etch process. An opening is formed in photoresist layer 122 by a normal photolithographic process, and an opening 123 is etched in hard mask layer 121 through the opening in photoresist layer 122.

As shown in FIG. 2B, substrate 120 is etched through the opening 123 to form a trench 124. It is generally preferably to remove photoresist layer 122 prior to the etching of the trench, since photoresist layer 122 may interfere with the trench etching process, change shape during the trench etching process, and possibly introduce undesirable organic contaminants into the trench. A reactive ion etch (RIE) can be used to achieve an anisotropic etch, producing a trench 124 having vertical walls. A relatively thin oxide layer 125 is grown thermally on the walls and floor of trench 124. If desired, a sacrificial oxide layer can be formed to remove crystal defects caused by the RIE process, the sacrificial oxide layer can be removed, and then a second oxide layer can be grown. The thickness of oxide layer 125 could be from 100 to 1000 Å, typically about 300-400 Å. If trench 124 is later filled with a doped dielectric material, oxide layer 125 will prevent the dopant from entering the semiconductor material surrounding trench 124.

As shown in FIG. 2C, a relatively thick layer 126 of a glass such as borophosphosilicate glass (BPSG) is spun onto the surface of substrate 120, completely filling trench 124. The BPSG could be doped to reduce its viscosity, or it could be undoped. Alternatively, the BPSG could be deposited by chemical vapor deposition (CVD). As described above, if the BPSG layer 126 is doped, oxide layer 125 acts as a barrier to prevent the dopant from entering and doping substrate 120. BGSG layer 126 is sufficiently thick (e.g., 0.5 to 1.0 µm thick) that its top surface is relatively planar, with only a small dent over the location of trench 124. If desired, a high temperature reflow can be used to further planarize the surface of BPSG layer 126.

Figure 2F:
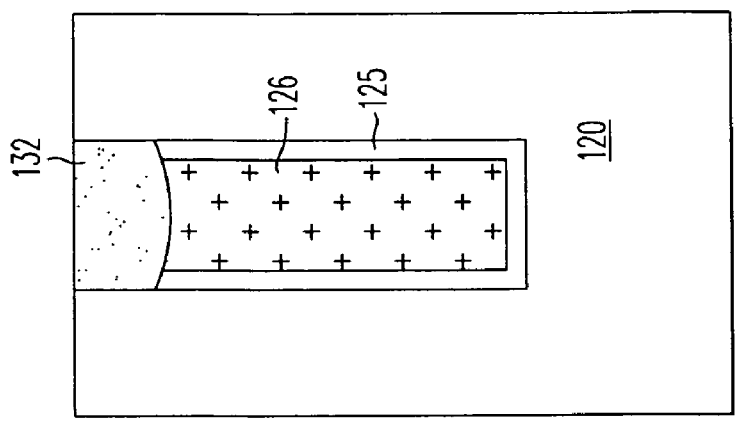
Figure 2E:
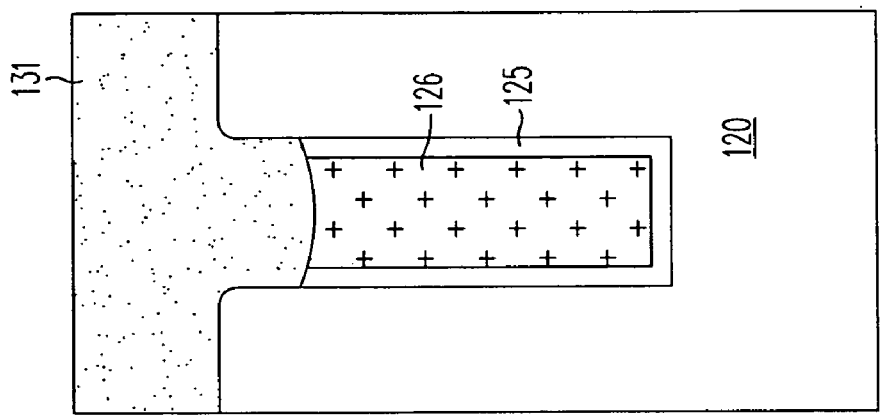
Figure 2D:
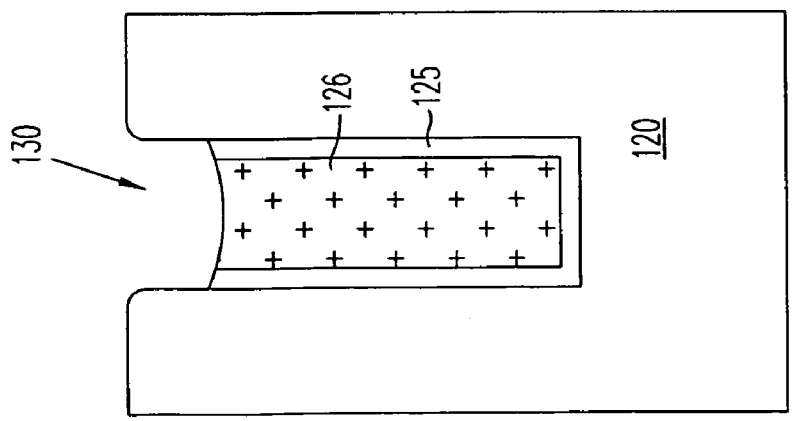

As shown in FIG. 2D, BPSG layer 126 and sidewall oxide layer 125 are etched back until their top surfaces are below the surface of substrate 120, forming a recess 130. Following the etchback, the surface of BPSG layer 126 may be from 0.1 to 0.5 µm (typically about 0.2 to 0.3 µm) below the surface of substrate 120. Then, as shown in FIG. 2E, a layer 131 of another dielectric is deposited, filling recess 130 and overflowing the surface of substrate 120. Layer 131 is then planarized by CMP or etchback to form a protective cap 132, which completely covers and protects oxide layer 125 and BPSG layer 126. The top surface of cap 132 is preferably coplanar with the surface of substrate 120, although it could vary by 0.1 µm in height across the wafer. FIG. 2F shows the structure after cap 132 has been formed.

Layer 131 and cap 132 should be formed of a material that is not significantly etched by the cleaning and etching steps that are to take place later in the process. In this embodiment, for example, layer 131 may be formed of silicon nitride. In general, the material of which layer 131 is formed does not etch at all, or etches substantially slower than BPSG layer 126 or oxide layer 125, in the subsequent processing steps. A protective cap according to this invention can be formed at any time during the process to protect the trench-fill material from subsequent erosion of the kind shown in FIG. 1C.

It should be noted that in general materials such as silicon nitride that can provide a protective shield against further etching typically do not deposit very uniformly and thus it is difficult to get them to fill a trench. Moreover, silicon nitride tends to crack when deposited thickly. These problems are overcome by filling the trench with a softer, less brittle material such as BPSG and then covering the material with a relatively thin protective cap of a harder, more brittle material such as silicon nitride.

Table 1 shows the relative removal rates of materials that can be used to fill the trench for several etchants or removal methods.

TABLE 1

| Dielectric Fill Materials | Etchant or Removal Method | | | | |
| --- | --- | --- | --- | --- | --- |
| | 100:1 HF | 10:1 HF | Selective plasma oxide etch | Selective "nitride" plasma etch | CMP |
| Thermal SiO$_2$ | 30 Å/min | 175 Å/min | Ox: 500 Å/min<br>Nit: <20 Å/min | Nit: 1200 Å/min<br>Ox: 420 Å/min | |
| Spin-on glass (SOG) | | | | | |
| BPSG | 1240 Å/min | 7362 Å/min | 8200 Å/min | | 1800 Å/min |
| Polyimide | 5 Å/min | 8 Å/min | | | |

Figure 3C:
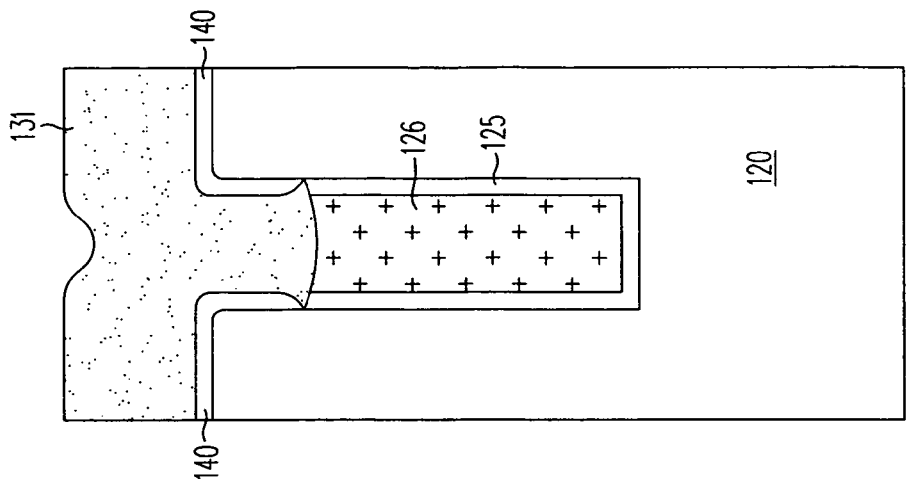
FIGS. 3A-3D illustrate a process for forming a modified version of the isolation structure of FIG. 2F where an oxide layer is formed on the walls of the trench adjacent the protective cap.
Figure 3B:
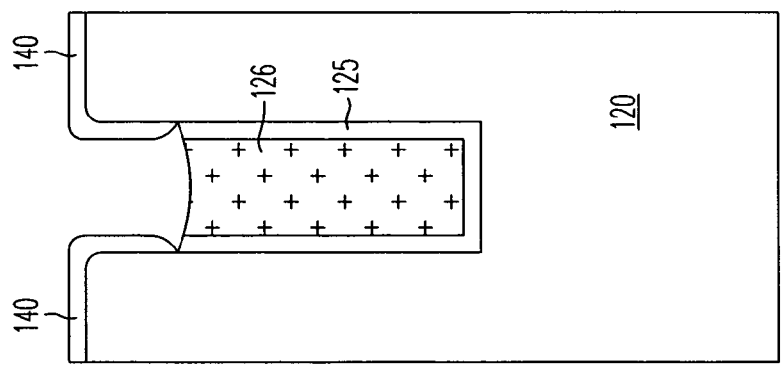
Figure 3A:
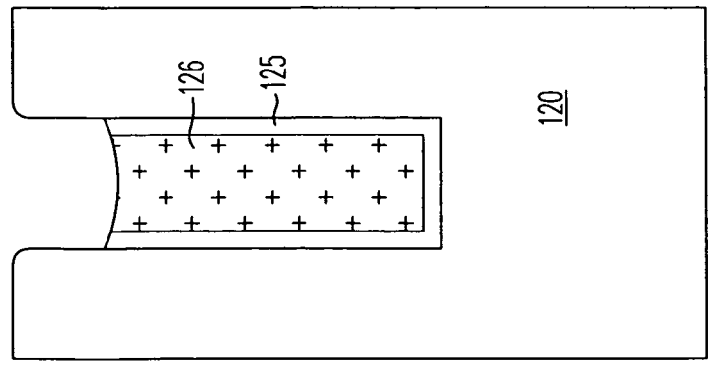
Figure 3D:
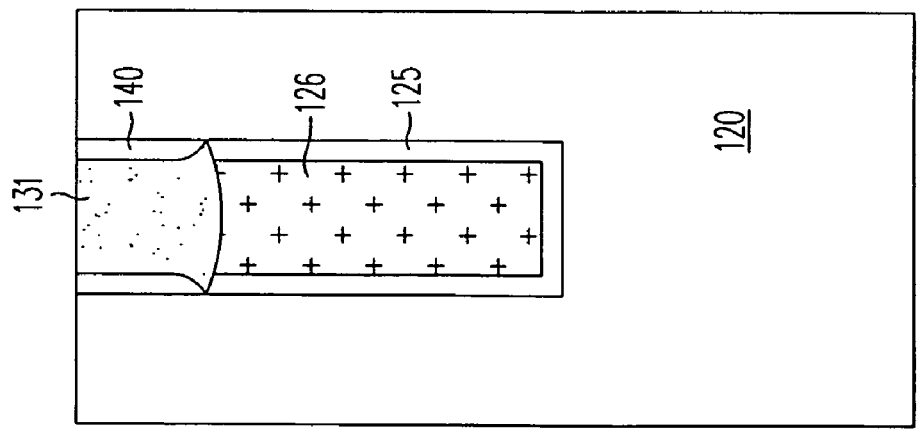

There are numerous variations of the process illustrated in FIGS. 2A-2F. One such variation is shown in FIGS. 3A-3D. FIG. 3A is similar to FIG. 2D and shows the structure after BPSG layer 126 and oxide layer 125 have been etched back until their top surfaces are below the surface of substrate 120. As shown in FIG. 3B, a thin oxide layer 140 is then thermally grown on the surface of substrate 120 and, as shown in FIG. 3C, nitride layer 131 is then deposited. In this embodiment oxide layer 140 separates nitride layer 131 from semiconductor substrate 120. Alternatively, an oxynitride layer may be deposited using chemical vapor deposition (CVD). When nitride layer 131 is planarized or etched back, as shown in FIG. 3D, the nitride cap that remains in the trench is not in contact with the sidewalls of the trench. While this cap may not provide as effective a seal as the embodiment show in FIG. 2F, the presence of oxide (or oxynitride) layer 140 on the walls of the trench tends to reduce the stress that is attributable to the different thermal expansion coefficients of nitride and silicon, respectively. Oxide (or oxynitride) layer 140 thus provides stress relief.

Figure 4:
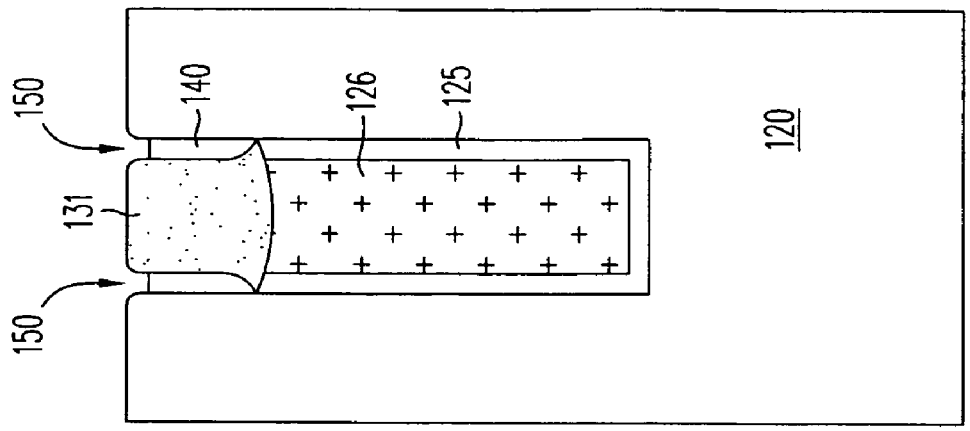
FIG. 4 illustrates how the oxide layer shown in FIG. 3D may be eroded in subsequent processing.

Moreover, even if oxide layer 140 is over-etched to leave a small gap 150, as shown in FIG. 4, gap 150 is nonetheless much smaller than the recess 103, shown in FIG. 1C, and much easier to fill with a subsequent layer of, for example, BPSG. It is preferable, however, not to remove all of oxide layer 140.

Figure 5:
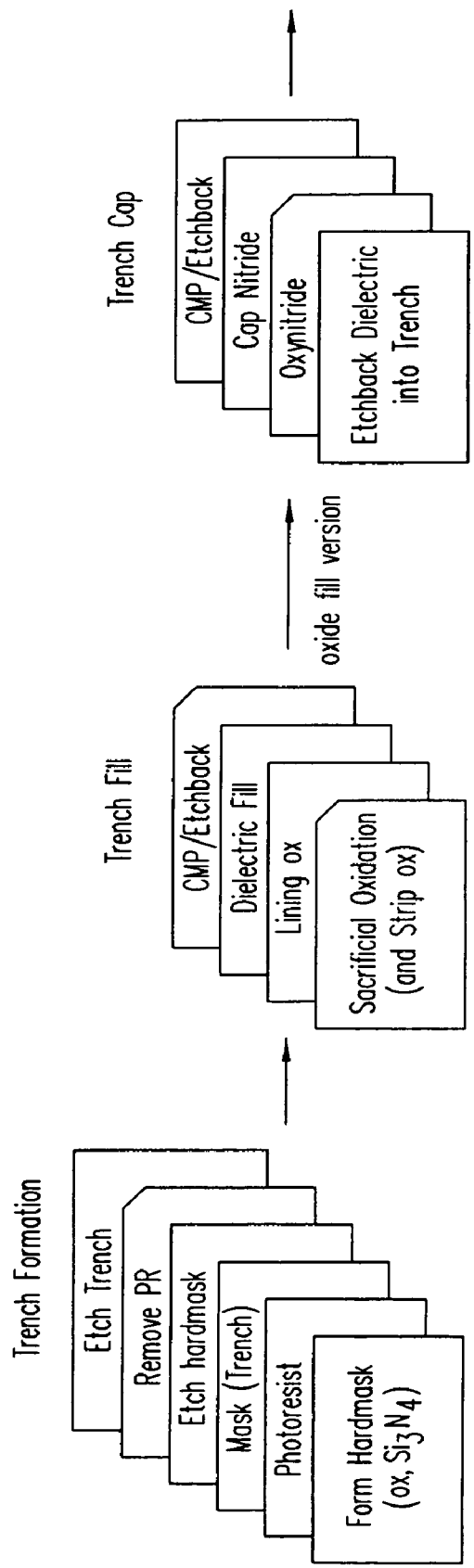
FIG. 5 is a flow chart, in "card" form, of the processes shown in FIGS. 2A-2F and 3A-3D.

FIG. 5 is a flow chart summarizing the processes described above, each step being represented by a "card" (the clipped cards denoting optional steps). In the first sequence the trench is formed by depositing a hard mask layer (e.g., oxide or nitride), depositing a photoresist layer, patterning the photoresist layer to create a trench mask, etching the hard mask layer through an opening in the trench mask, optionally removing the photoresist layer, and etching the trench through an opening in the hard mask layer.

In the next sequence, optionally a sacrificial oxide layer can be formed on the walls of the trench and removed, a lining oxide layer is grown, the trench is filled with a dielectric (e.g., BPSG), and optionally the dielectric can be planarized by etching or CMP.

Finally, the dielectric fill is etched back into the trench, optionally an oxynitride or oxide layer is grown or deposited on the walls of the trench, and a nitride layer is deposited and etched back until it is substantially coplanar with the top surface of the substrate.

Figure 6A:
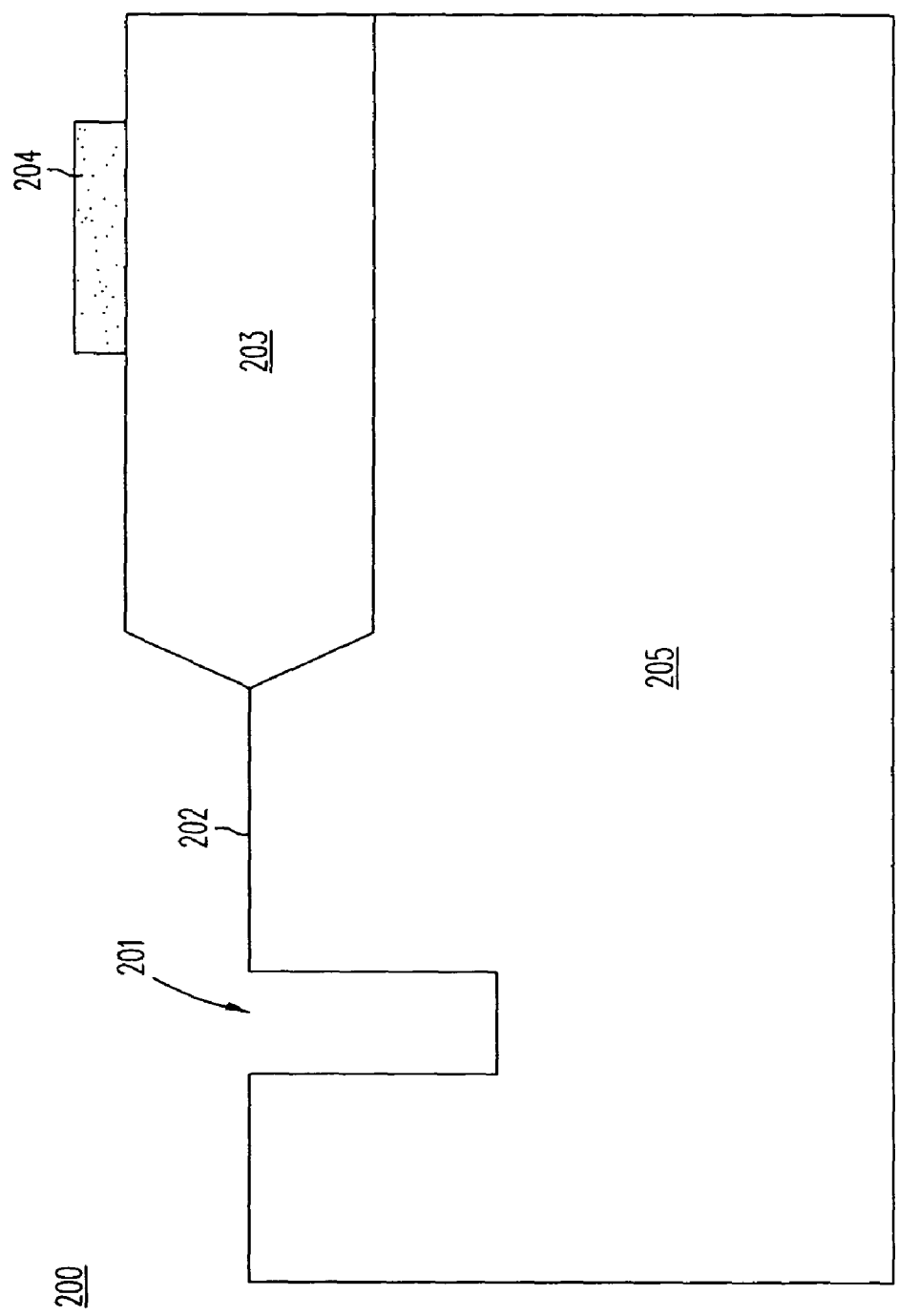
FIGS. 6A-6C illustrate a process for forming isolation structures that include a broad or wide field oxide region and a relatively narrow dielectric-filled trench.

The examples above describe a structure wherein the surface of the substrate is essentially planar. A non-planar structure 200 is illustrated in FIG. 6A. A substrate 205 has a top surface 202. A trench 201 has been etched in substrate 205 and a field oxide region 203 has been thermally grown in the substrate such that field oxide region extends upward beyond the surface 202 as well as downward into the substrate. A polysilicon layer 204 has been deposited on top of field oxide region 203. As is apparent, there is a considerable height difference between the bottom of trench 201 and the top of polysilicon layer 204. If trench 201 is filled with a dielectric, an etchback can be used to planarize the surface of the dielectric with surface 202. Otherwise, if CMP is used to planarize the dielectric, it is clear that polysilicon layer 204 as well as a portion of field oxide region 203 will be removed.

Figure 6C:
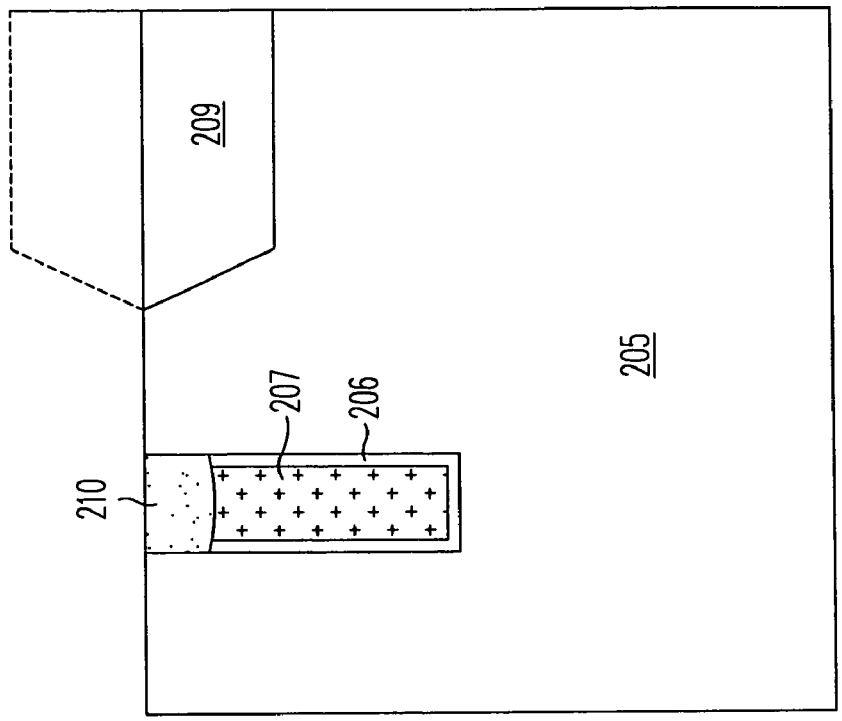
Figure 6B:
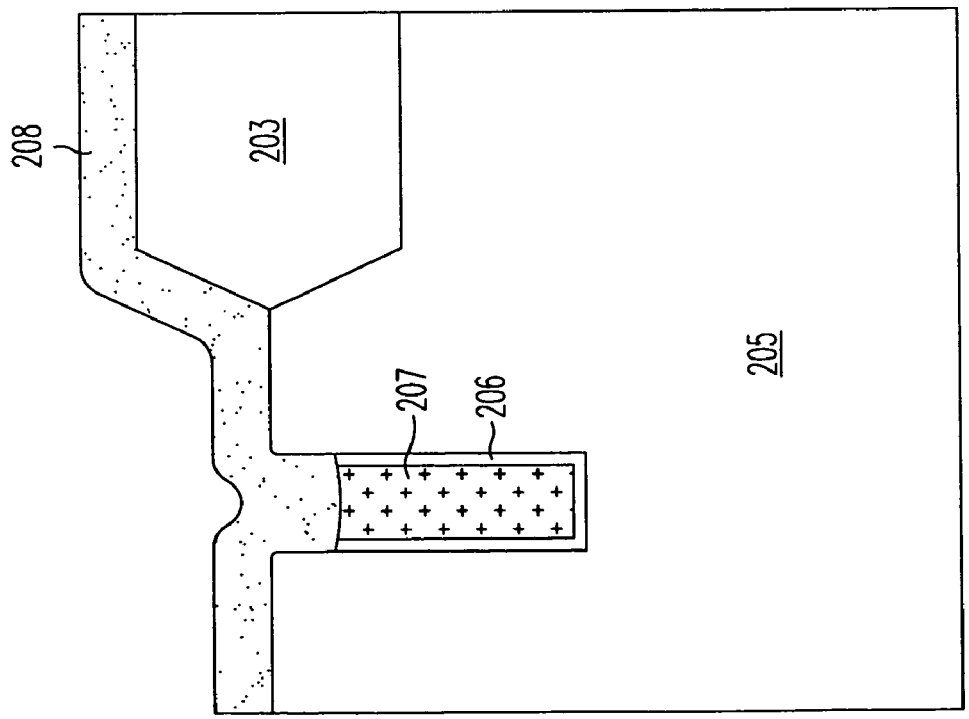

One solution to this problem is to omit the polysilicon 204 (or to postpone the formation of polysilicon 204 until later in the process flow) and to grow the field oxide region 203 thick enough that the portion below the surface 202 is sufficient to provide the necessary electrical characteristics. FIG. 6B shows trench 201 lined with an oxide layer 206 and filled with BPSG 207, both of which have been etched back into the trench. The entire structure is covered with a nitride layer 208, which also fills the upper portion of the trench. In FIG. 6C, the top surface has been planarized by CMP, leaving the bottom portion 209 of field oxide region 203 and a protective nitride cap 210 over the BPSG 207 and oxide layer 206. The top surface is totally flat. Since having a nonplanar top surface greatly complicates further processing, the flat structure shown in FIG. 6C is preferable to the structure shown in FIG. 6A. Furthermore, since field oxide region 203 is grown by thermal means, the remaining region 209 can be very wide, whereas the trench can be very narrow. To summarize, the structure shown in FIG. 6C includes a "capped" trench that is resistant to etching because of cap 210 and an "uncapped" field oxide region 209.

As an alternative, FIGS. 7A-7H illustrate a process by which a wide isolation trench and a narrow isolation trench can be formed using a minimal number of steps.

Figure 7B:
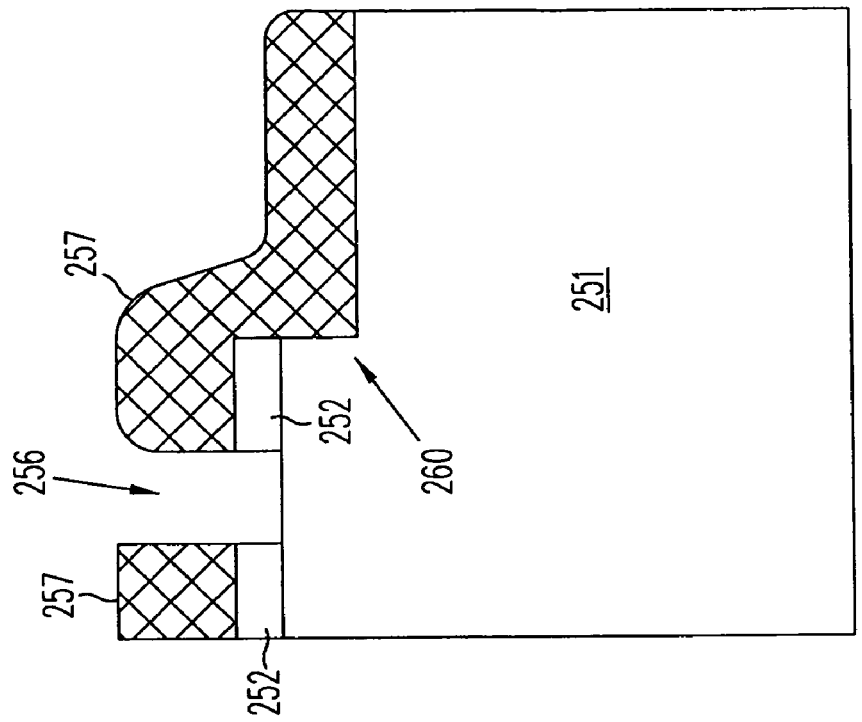
Figure 7A:
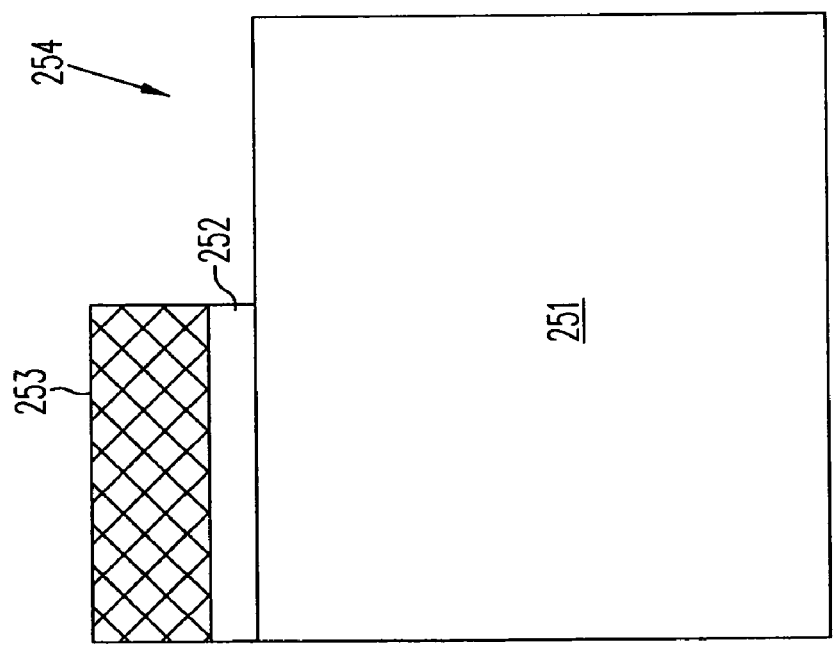

In FIG. 7A, a hard mask layer 252 has been deposited on a substrate 251, and a photoresist layer 253 has been deposited on top of hard mask layer 252. Photoresist layer 253 is etched to form a wide opening and hard mask layer 252 is etched through the wide opening in photoresist layer 253 to form a wide opening 254 which exposes the surface of substrate 251.

As shown in FIG. 7B, substrate 251 is etched by RIE to form a wide trench 260. Photoresist layer 253 is removed and a new photoresist layer 257 is deposited. If trench 260 is not too deep, photoresist layer 257 will cover the step between the bottom of trench 260 and the top surface of substrate 251. A relatively narrow opening is etched in photoresist layer 257, and hard mask layer 252 is etched through the opening in photoresist layer 257 to form a narrow opening 256 which exposes the surface of substrate 251. Alternatively, layer 257 may represent a deposited hard mask dielectric layer patterned and etched by a photoresist layer (not shown).

As shown in FIG. 7C, substrate 251 is etched by RIE to form a narrow trench 261. Photoresist (or hard mask) layer 257 and hard mask layer 252 are then removed, or patterned and etched.

Optionally, a sacrificial oxide layer (not shown) can be grown in trenches 260 and 261 and removed to repair any crystal damage resulting from the RIE processes. As shown in FIG. 7D, a thin oxide layer 262 is grown as a barrier against the diffusion of dopants into substrate 251, and a layer 263 of BPSG is deposited over the entire surface of the structure. Alternatively, layer 263 could include any doped or undoped CVD-deposited or spin-on silicon oxide or silicate glass or any other dielectric "fill" material, provided that the dielectric fill material exhibits sufficiently low stress so as to avoid cracking during subsequent processing steps, during assembly, and during temperature variations encountered during device operation.

Of course, the process sequence could be revised such that the narrower trench is formed before the wider trench.

Next, as shown in FIG. 7E, the entire top surface of the structure is planarized by CMP or by a short chemical etch-back followed by CMP.

Optionally, oxide layer 262 and BPSG layer 263 are etched back (e.g., by an acid or dry etch) into trenches 260 and 261 to form depressions 270 and 271, as shown in FIG. 7F. A layer 280 of dielectric dissimilar to silicon dioxide, silicate glass, or BPSG (e.g., nitride or polyimide) is deposited over the top surface of the structure, as shown in FIG. 7G, and the top surface is again planarized to form protective caps 280 in the mouths of trenches 260 and 261, shown in FIG. 7H. Unlike the dielectric fill material 263, the material used to form caps 280 may comprise a brittle or high stress material, provided that the material is not eroded by the normal etches encountered during subsequent wafer processing in IC manufacturing and provided that caps 280 are made sufficiently thin to avoid cracking.

Figure 8D:
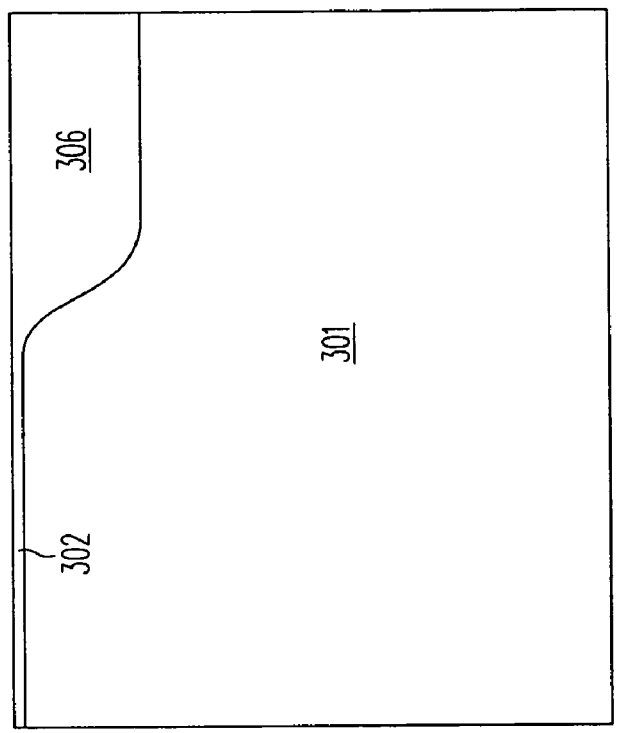
Figure 8C:
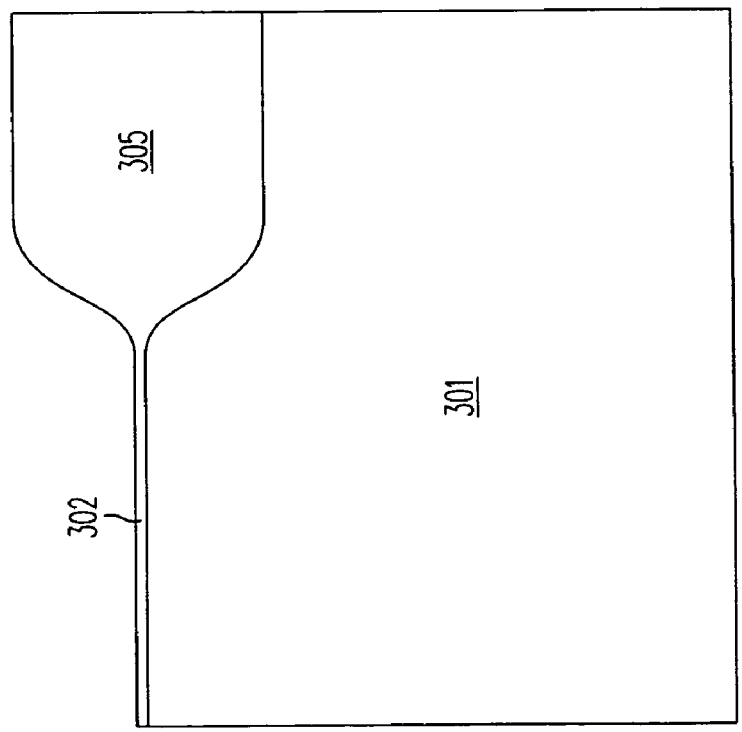

FIGS. 8A-8J illustrate a process for forming a capped isolation trench and capped field oxide region. As shown in FIG. 8A, a pad oxide layer 302 is grown on silicon substrate 301, and as in a typical local oxidation of silicon (LOCOS) sequence, a nitride layer 303 is deposited on pad oxide layer 302. Pad oxide layer can be 300 to 1000 Å thick, for example. Nitride layer 303 is etched through a mask layer (not shown) to form a wide opening 304 which exposes pad oxide layer 302. As shown in FIG. 8B, the structure is heated (for example, to 900-1100° C. for 1 to 4 hours) to form a thick field oxide region 305 in opening 304. As is normal in a LOCOS process, nitride layer 303 is lifted up by the expanding oxide at the edge of opening 304, forming the familiar "bird's beak" shape. Next, the remaining portion of nitride layer 303 is etched (FIG. 8C), and the top surface is planarized by a CMP process, yielding the result shown in FIG. 8D, with a smooth transition between the remaining portion 306 of field oxide region 305 and pad oxide layer 302.

Figure 8F:
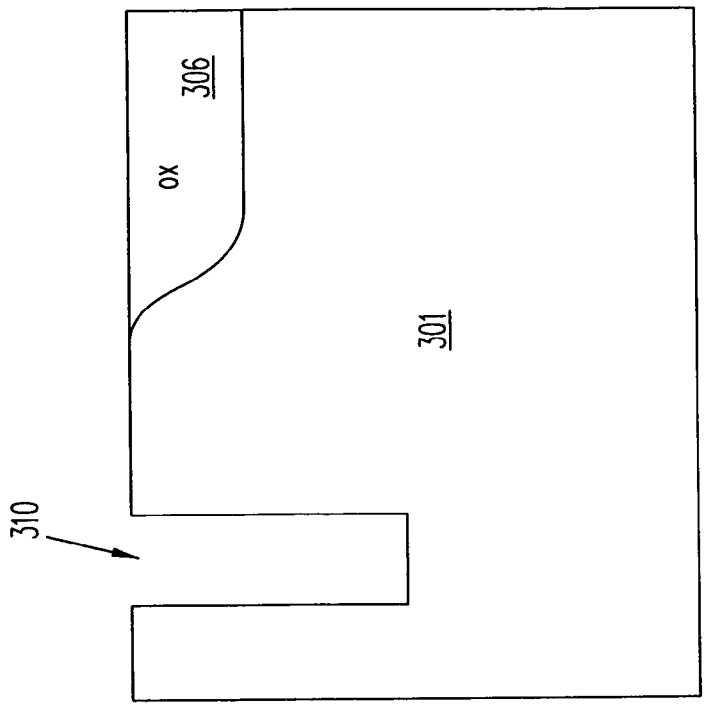
Figure 8E:
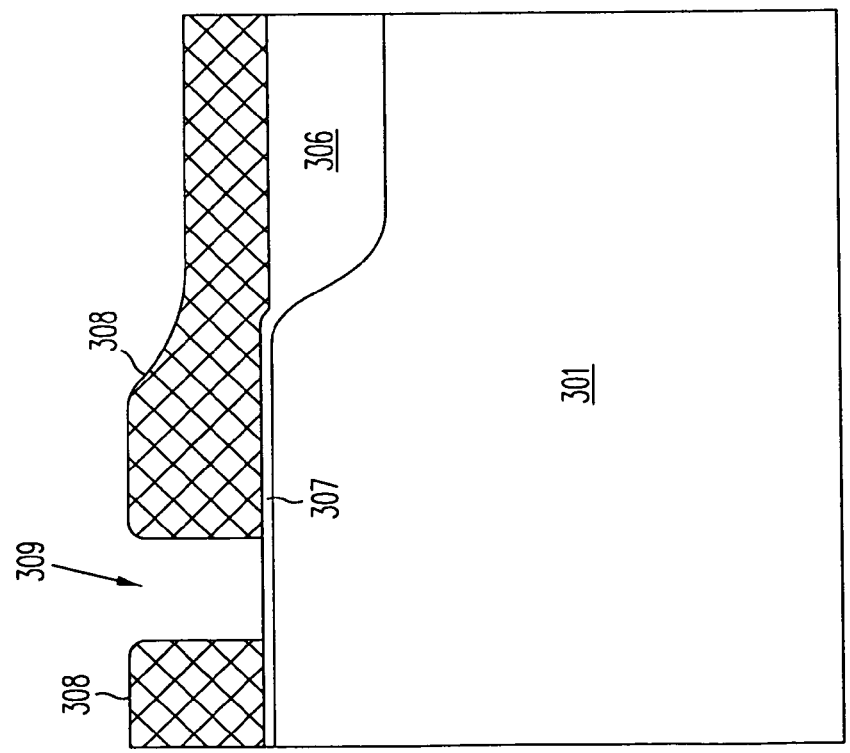

Next, as shown in FIG. 8E, a photoresist layer 308 is deposited and patterned to form a narrow opening 309. Oxide layer 307 is etched through opening 309 and, as shown in FIG. 8F, substrate 301 is etched by an RIE process to form a narrow trench 310, with oxide layer 307 acting as a hard mask. The remains of oxide layer 307 may be removed in a short cleaning step.

Figure 8G:
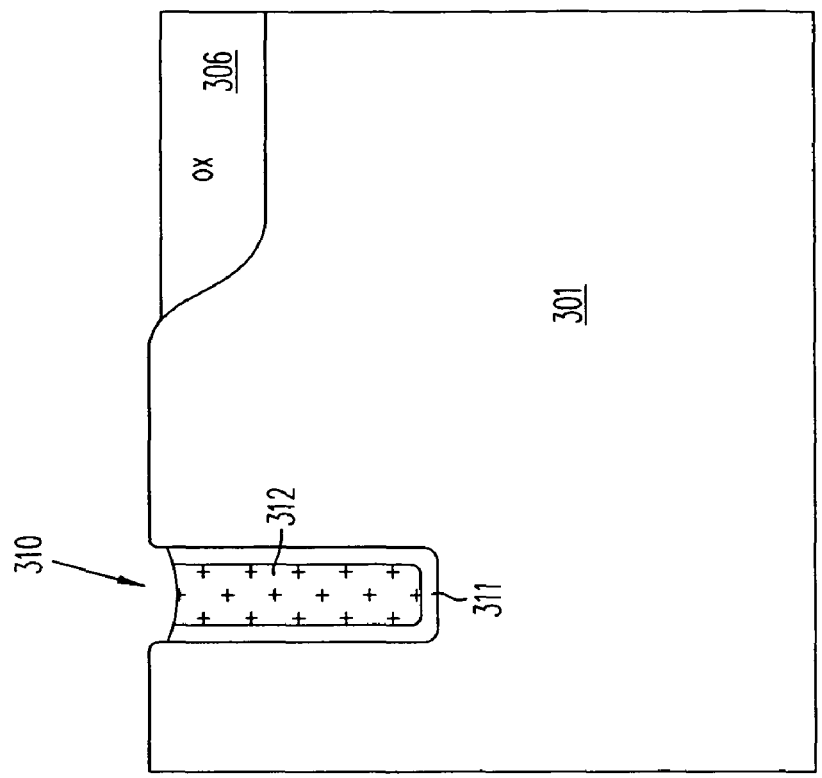

As shown in FIG. 8G, a thin oxide layer 311 is grown on the walls of trench 310 and a layer 312 of BPSG or any other dielectric filler is deposited. The top surface of substrate 301 is planarized by etching or CMP.

Figure 8H:
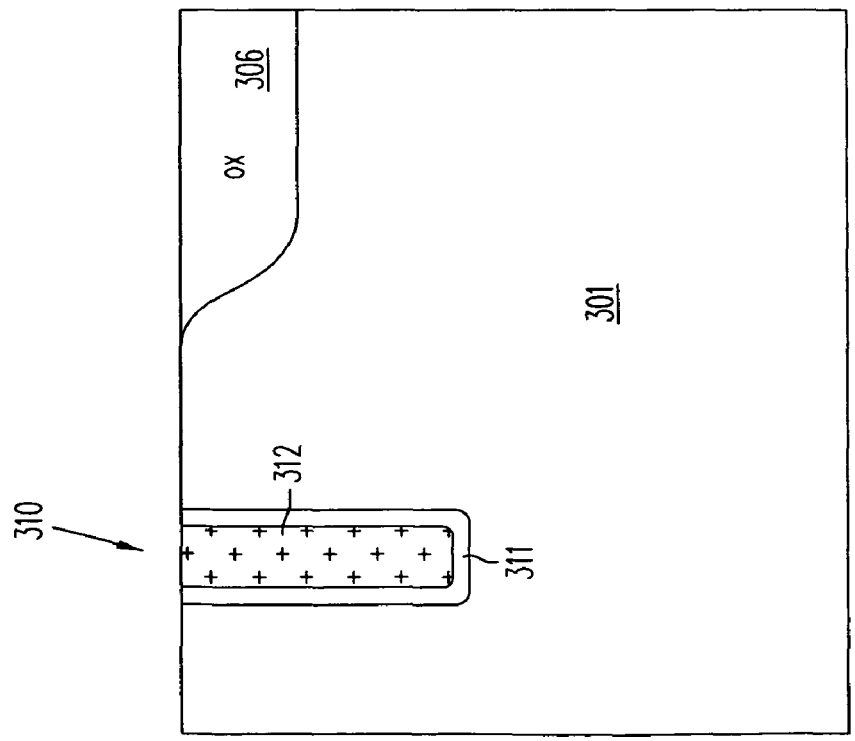
Figure 8I:
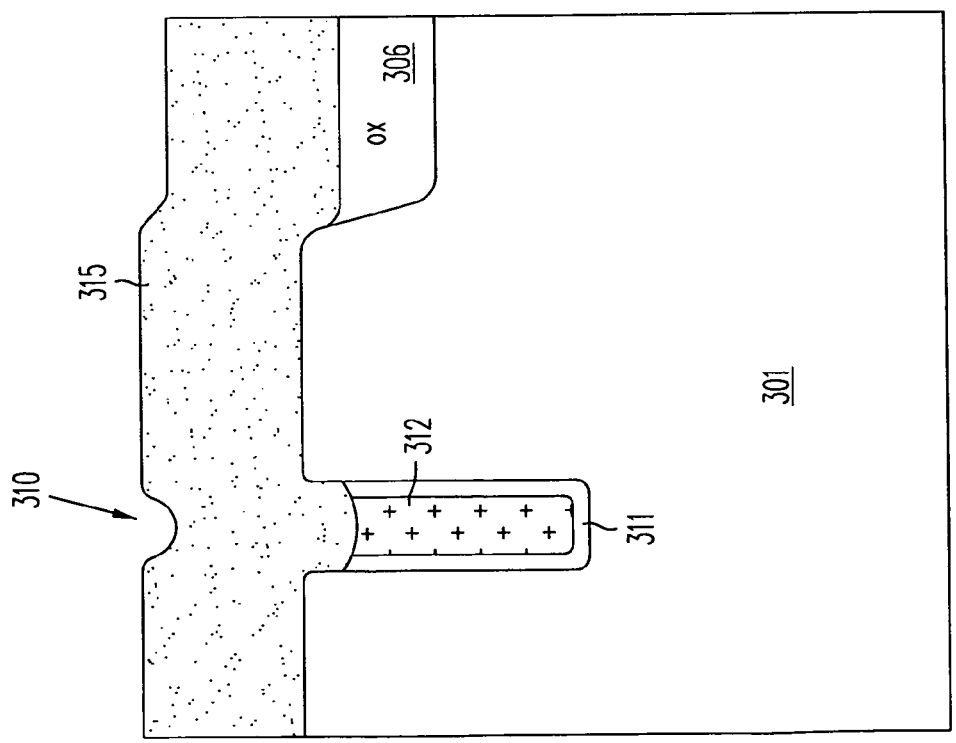
Figure 8J:
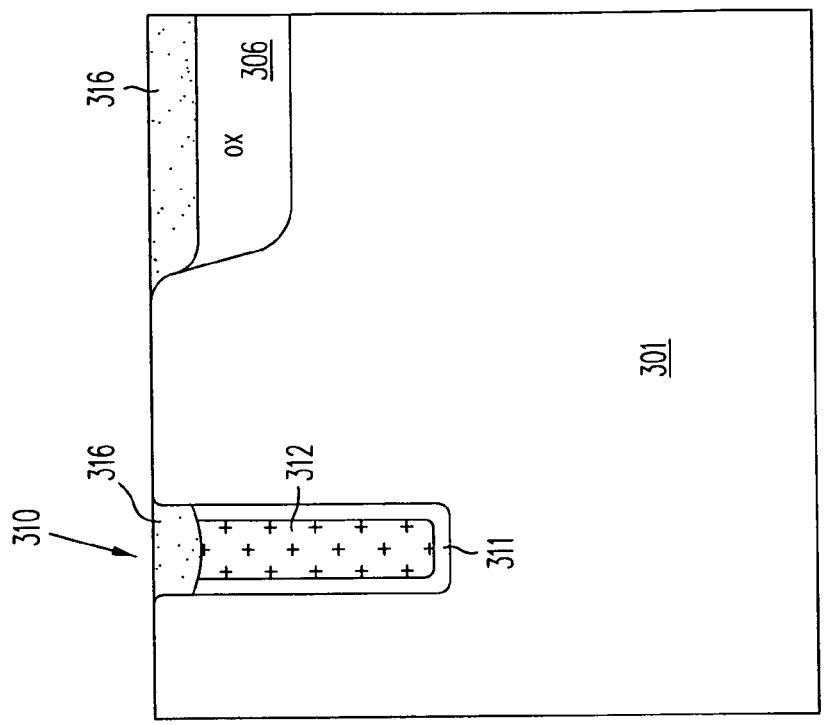

As shown in FIG. 8H, oxide layer 311 and BPSG layer 312 in trench 310 and the remaining portion 306 of field oxide region 305 are etched back until the top surfaces of these elements are below the top surface of substrate 301. A layer 315 of a dissimilar dielectric such as nitride is deposited over the structure (FIG. 8I), and the structure is again subjected to a CMP process to planarize the top surface and create protective caps 316 over trench 310 and field oxide 306 (FIG. 8J).

FIGS. 9A-9E illustrate a process that produces a structure having field doping regions under the field oxide isolation regions but not under the trench isolation structures.

In FIG. 9A, a pad oxide layer 351 has been grown on silicon substrate 350, and a nitride layer 352 and photoresist layer 353 have been deposited in that order on top of pad oxide layer 351. Photoresist layer 353 is patterned to form two openings 354A and 354B, and nitride layer 352 is etched through openings 354A and 354B to expose pad oxide layer 351. Phosphorus (P+) is implanted through openings 354A and 354B to form N-type regions 356A. The dose of the phosphorus implant is typically in the range of $5 \times 10^{12}$ to $3 \times 10^{13}$ cm$^{-2}$ and the implant energy is typically from about 80 to 120 keV.

As shown in FIG. 9B, photoresist layer 353 is removed, and a new photoresist layer 355 is deposited and patterned to form an opening that includes the location of former opening 354B in photoresist layer 353. Boron (B+) is implanted through the opening in photoresist layer 355 to form a P-type region 356B. Since the dose of the boron implant is typically an order of magnitude greater than the phosphorus implant (e.g., $8 \times 10^{13}$ to $2 \times 10^{14}$ cm$^{-2}$) the boron counterdopes the phosphorus region under opening 354B to form P-type region 356B. The energy of the boron implant is typically 60 to 120 keV.

Figure 9D:
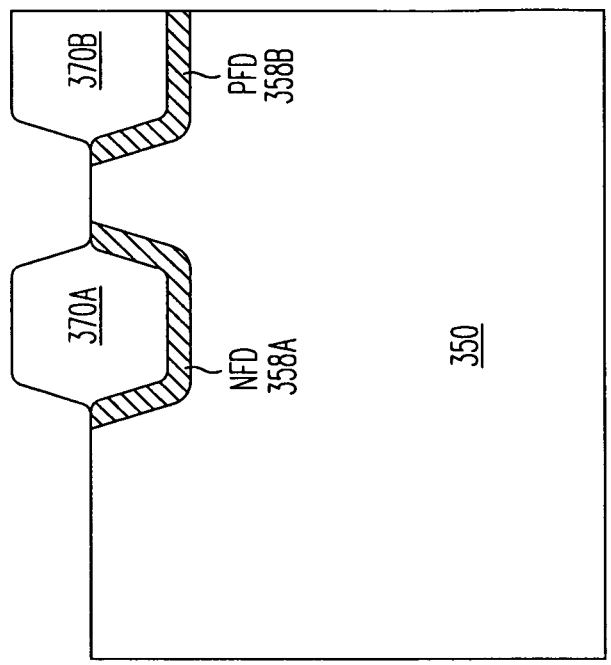
Figure 9C:
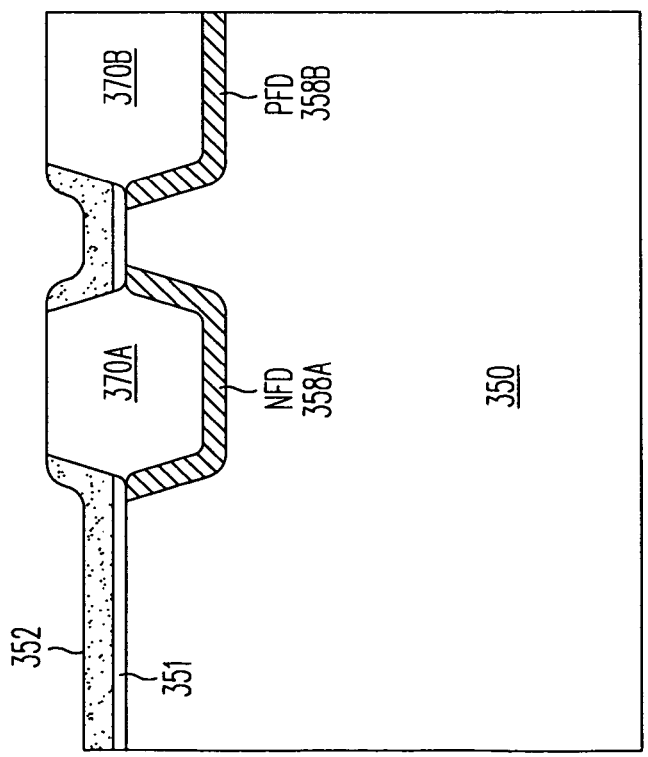

Next, as shown in FIG. 9C, the structure is heated to form thick field oxide regions 370A and 370B in the locations of openings 354A and 354B. Field oxide regions 370A and 370B could be from 2000 Å to 2 μm in thickness (typically about 0.8 μm). This thermal process also activates the phosphorus and boron dopants and forms an N-type field doping region 358A under field oxide region 370A and a P-type field doping region 358B under field oxide region 370B.

Figure 9E:
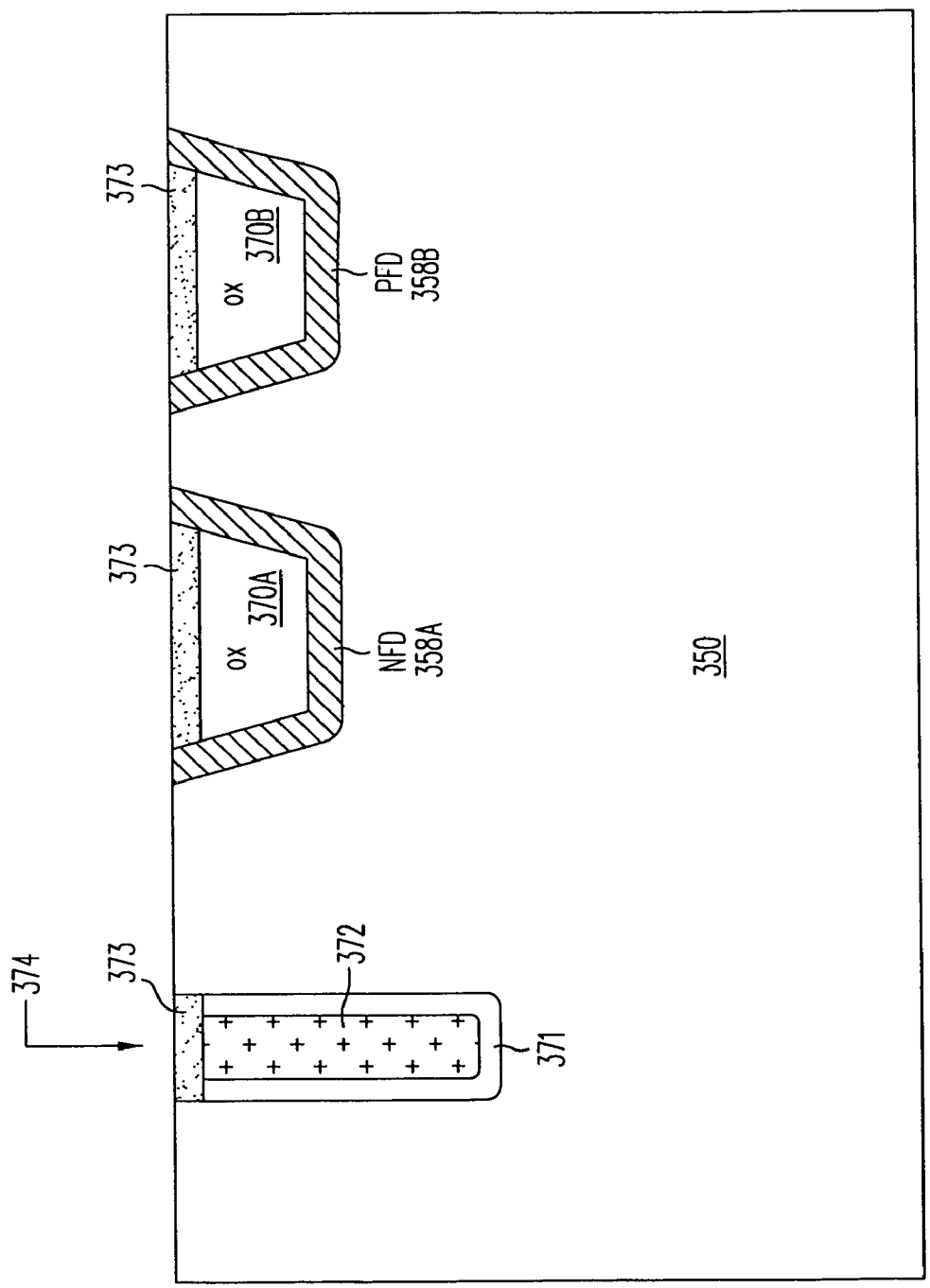

The remains of nitride layer 352 are removed (FIG. 9D), and optionally a sacrificial oxidation may be preformed. Next, as shown in FIG. 9E, a trench 374 is etched and oxidized to form an oxide layer 371, followed by a dielectric fill with a material such as BPSG 372 in the manner described previously. The top surface of the structure is planarized by CMP or etchback, and oxide layer 371, BPSG 372 and the remains of field oxide regions 370A and 370B are etched back in the manner described above. A layer of nitride (or another dielectric dissimilar to the material used to fill trench 374) is deposited on the top surface, and the surface is then planarized to form protective caps 373.

Alternatively, a layer of polyimide may be substituted for nitride layer 352 and may be used to form the hard mask for etching trench 374.

This process yields a relatively narrow trench with no field doping which might be used to isolate low-voltage devices, for example, and wide field oxide regions with field doping which might be used to isolate high-voltage CMOS devices, for example. The process gives the designer the ability to form isolation regions of different widths and different field dopings in the same semiconductor substrate, with a flat top surface to simply any further processing. Moreover, the isolation regions can be formed with protective caps, if desired.

In some embodiments, the material in the trench is protected by a graded dielectric fill in lieu of a discrete trench cap. In such embodiments, the trench is at least partially filled with a mixture of a relatively soft, low stress dielectric and a relatively hard, etch resistant dielectric. The proportion of the relatively hard, etch resistant dielectric in the mixture increases as one approaches the mouth of the trench. For example, a mixture of silicon dioxide and silicon nitride may be deposited in the trench, with the percentage of silicon nitride in the mixture being increased near the mouth of the trench.

While specific embodiments of this invention have been described, it should be understood that these embodiments are illustrative only, and not limiting. Many additional or alternative embodiments in accordance with the broad principles of this invention will be apparent to those of skill in the art.

I claim:

1. A method of forming an isolation structure in a semiconductor substrate comprising:
   depositing a first mask layer on the substrate;
   depositing a second mask layer on the first mask layer;
   patterning the second mask layer to form a first opening having a first width;
   etching the first mask layer through the first opening to form a second opening having a width substantially equal to the first width;
   etching the substrate through the second opening to form a first trench having a width substantially equal to the first width;
   removing the second mask layer;
   depositing a third mask layer over a remaining portion of the first mask layer;
   patterning the third mask layer to form a third opening having a second width, the second width being unequal to the first width;
   etching the first mask layer through the third opening to form a fourth opening having a width substantially equal to the second width;
   etching the substrate through the fourth opening to form a second trench having a width substantially equal to the second width;
   depositing a first dielectric material so as to completely fill the first and second trenches; and
   removing a portion of the first dielectric material such that surfaces of the first dielectric material in the first and second trenches, respectively, are located at a first level, the first level being no higher than a plane substantially coplanar with a surface of the substrate, wherein removing a portion of the first dielectric material comprises removing a portion of the first dielectric material such that surfaces of the first dielectric material in the first and second trenches, respectively, are located below a plane defined by the surface of the substrate, thereby forming a first recess in the first trench and a second recess in the second trench.

2. The method of claim 1 comprising;
   depositing a second dielectric material in the first and second recesses; and
   removing a portion of the second dielectric material such that surfaces of the second dielectric material in the first and second trenches are substantially coplanar with the surface of the substrate, thereby forming a first protective cap in the first trench and a second protective cap in the second trench.

3. The method of claim 2 wherein the second dielectric material is relatively more resistant to removal by normal semiconductor processes as compared with the first dielectric material.

4. The method of claim 3 wherein the second dielectric material comprises one or more materials selected from the group consisting of silicon nitride and polyimide.

5. The method of claim 3 wherein the first dielectric comprises one or more materials from the group consisting of the doped and undoped silicon oxides and silicate glasses.

6. The method of claim 5 wherein the first dielectric material comprises borophosphosilicate glass.

* * * * *